United States Patent
Barton

(10) Patent No.: US 6,724,194 B1
(45) Date of Patent: Apr. 20, 2004

(54) CELL VOLTAGE MONITOR FOR A FUEL CELL STACK

(75) Inventor: Russell Howard Barton, New Westminster (CA)

(73) Assignee: Ballard Power Systems Inc., Burnaby (CA)

( * ) Notice: Subject to any disclaimer, the term of this patent is extended or adjusted under 35 U.S.C. 154(b) by 0 days.

(21) Appl. No.: 09/607,796

(22) Filed: Jun. 30, 2000

(51) Int. Cl.⁷ .............................................. G01N 27/416
(52) U.S. Cl. ..................... 324/432; 324/433; 324/434; 324/106; 340/636.12; 429/90
(58) Field of Search ................................ 324/432, 433, 324/434, 429, 430, 431, 441, 106, 119; 320/134, 150, 151, 152, 153, 161–164; 361/91.5, 93.8, 106, 86

(56) References Cited

U.S. PATENT DOCUMENTS

| | | | |
|---|---|---|---|
| 2,624,033 A | * 12/1952 | Jacquier | 320/122 |
| 3,054,951 A | * 11/1962 | Richard | 324/106 |
| 3,576,492 A | * 4/1971 | Rao et al. | 324/106 |
| 3,633,036 A | * 1/1972 | Nuckolls et al. | 250/214 R |
| 3,808,534 A | 4/1974 | Summers et al. | 340/249 |
| 4,622,508 A | * 11/1986 | Matteau et al. | 320/118 |
| 4,904,548 A | 2/1990 | Tajima | 429/22 |
| 5,170,124 A | 12/1992 | Blair et al. | 324/434 |
| 5,460,901 A | * 10/1995 | Syrjala et al. | 429/90 |
| 5,546,262 A | 8/1996 | Baurand et al. | 361/31 |
| 5,703,471 A | * 12/1997 | Bullock et al. | 320/134 |
| 5,834,131 A | * 11/1998 | Lutz et al. | 429/7 |
| 5,835,320 A | * 11/1998 | Palmieri et al. | 361/106 |
| 6,172,479 B1 | * 1/2001 | Barton | 320/121 |
| 6,344,747 B1 | * 2/2002 | Lunghofer et al. | 324/537 |

FOREIGN PATENT DOCUMENTS

| | | |
|---|---|---|
| EP | 0 862 233 | 2/1998 |
| EP | 0 982 788 | 1/2000 |
| GB | 2086060 | 5/1982 |
| JP | 64-38968 | 2/1989 |
| JP | 6-54176 | 2/1994 |
| JP | 6-260195 | 9/1994 |
| JP | 8-213038 | 8/1996 |
| JP | 11-260385 | 9/1999 |
| JP | 11-273702 | 10/1999 |
| WO | WO 99/66339 | 12/1999 |
| WO | WO 99/67654 | 12/1999 |
| WO | WO 99/67869 | 12/1999 |
| WO | WO 00/02282 | 1/2000 |

* cited by examiner

Primary Examiner—Evan Pert
Assistant Examiner—Paresh Patel
(74) Attorney, Agent, or Firm—McAndrews, Held & Malloy, Ltd.

(57) ABSTRACT

Voltage reversal in fuel cell stacks may be detected and/or prevented by monitoring each cell or small groups of cells in the stack for low voltage conditions. An improved cell voltage monitor is constructed using a plurality of voltage monitoring units in which each unit comprises a heating resistor, a rectifier in series therewith, and a sensing thermistor in thermal communication with the heating resistor. The heating resistor is electrically-connected across a cell or cells and heats the associated sensing thermistor in accordance with the voltage of the cell(s). Since the resistance of the sensing thermistor is indicative of its temperature and hence also of voltage of the cell(s), the sensing thermistor resistance can be used to signal a low voltage condition.

29 Claims, 3 Drawing Sheets

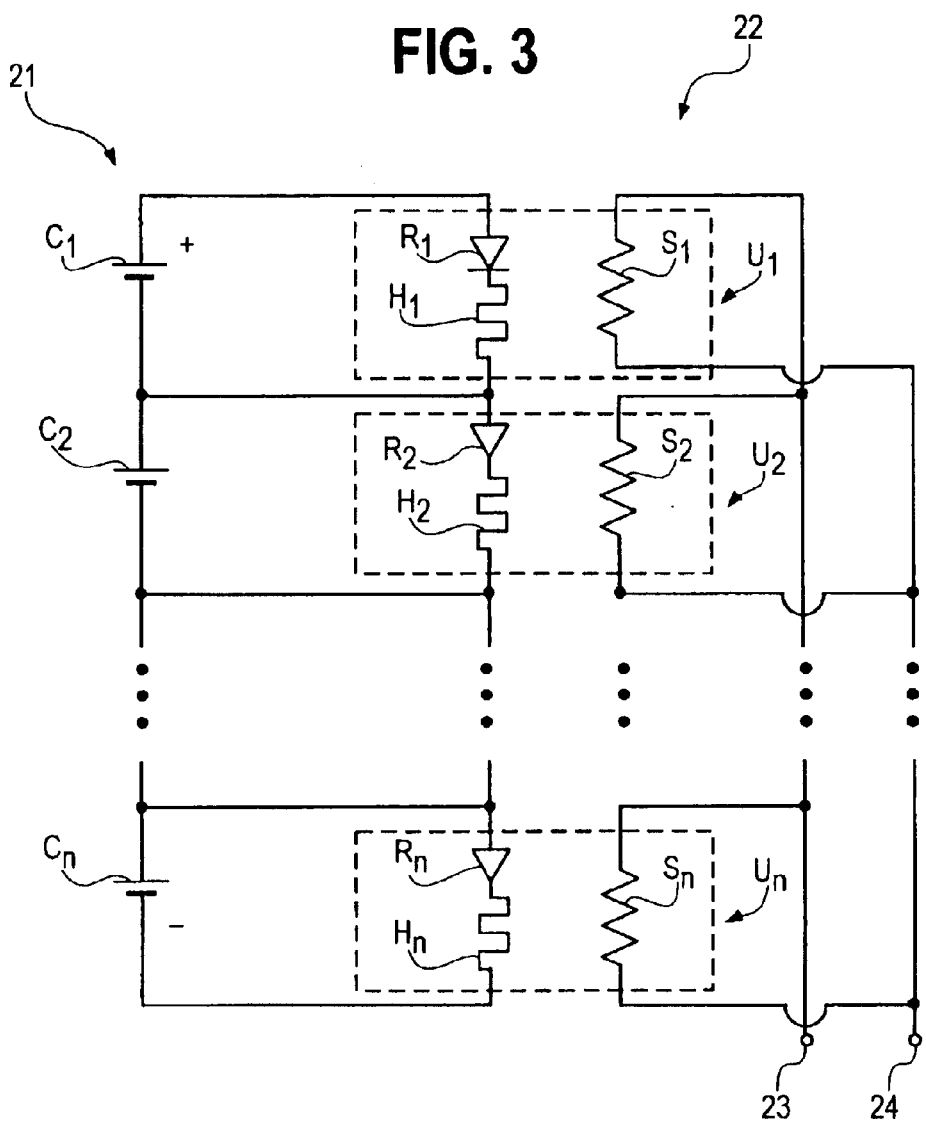

CELL VOLTAGE MONITOR FOR A FUEL CELL STACK

FIELD Of THE INVENTION

The present invention relates to apparatus and methods for monitoring cell voltages in fuel cell stacks. In particular, the present invention relates to monitoring cell voltages for purposes of detecting and preventing voltage reversal conditions in solid polymer electrolyte fuel cells.

BACKGROUND OF THE INVENTION

Fuel cell systems are currently being developed for use as power supplies in numerous applications, such as automobiles and stationary power plants. Such systems offer promise of economically delivering power with environmental and other benefits. To be commercially viable however, fuel cell systems need to exhibit adequate reliability in operation, even when the fuel cells are subjected to conditions outside the preferred operating range.

Fuel cells convert reactants, namely fuel and oxidant, to generate electric power and reaction products. Fuel cells generally employ an electrolyte disposed between two electrodes, namely a cathode and an anode. A catalyst typically induces the desired electrochemical reactions at the electrodes. Preferred fuel cell types include solid polymer electrolyte fuel cells that comprise a solid polymer electrolyte and operate at relatively low temperatures.

A broad range of reactants can be used in solid polymer electrolyte fuel cells. For example, the fuel stream may be substantially pure hydrogen gas, a gaseous hydrogen-containing reformate stream, or methanol in a direct methanol fuel cell. The oxidant may be, for example, substantially pure oxygen or a dilute oxygen stream such as air.

During normal operation of a solid polymer electrolyte fuel cell, fuel is electrochemically oxidized at the anode catalyst, typically resulting in the generation of protons, electrons, and possibly other species depending on the fuel employed. The protons are conducted from the reaction sites at which they are generated, through the electrolyte, to electrochemically react with the oxidant at the cathode catalyst. The catalysts are preferably located at the interfaces between each electrode and the adjacent electrolyte.

Solid polymer electrolyte fuel cells employ a membrane electrode assembly ("MEA") which comprises the solid polymer electrolyte or ion-exchange membrane disposed between the two electrodes. Separator plates, or flow field plates for directing the reactants across one surface of each electrode substrate, are disposed on each side of the MEA.

In operation, the output voltage of an individual fuel cell under load is generally below one volt. Therefore, in order to provide greater output voltage, numerous cells are usually stacked together and are connected in series to create a higher voltage fuel cell stack. (End plate assemblies are placed at each end of the stack to hold it together and to compress the stack components together. Compressive force is needed for effecting seals and making adequate electrical contact between various stack components.) Fuel cell stacks can then be further connected in series and/or parallel combinations to form larger arrays for delivering higher voltages and/or currents.

However, fuel cells in series are potentially subject to voltage reversal, a situation where a cell is forced to the opposite polarity by the other cells in the series. This can occur when a cell is unable to produce the current forced through it by the rest of the cells. Groups of cells within a stack can also undergo voltage reversal and even entire stacks can be driven into voltage reversal by other stacks in an array. Aside from the loss of power associated with one or more cells going into voltage reversal, this situation poses reliability concerns. Undesirable electrochemical reactions may occur, which may detrimentally affect fuel cell components. Component degradation reduces the reliability and performance of the fuel cell.

The adverse effects of voltage reversal can be prevented, for instance, by employing rectifiers capable of carrying the stack current across each individual fuel cell. Alternatively, the voltage of each individual fuel cell may be monitored and an affected stack shut down if a low cell voltage is detected. However, given that stacks typically employ numerous fuel cells, such approaches can be quite complex and expensive to implement.

The complexity and expense of cell voltage monitors can be reduced by monitoring and comparing the voltages of suitable groups of cells instead of individual cells, as disclosed in U.S. Pat. No. 5,170,124. Another approach is disclosed in European Patent publication number EP 982788 in which optoisolators are used to monitor voltages across pairs of cells in a stack. A photoemitter activates and illuminates a photo-detector in each optoisolator when the summed voltage of the monitored pair of cells exceeds an activating voltage. The photo-detectors are connected in series and current can pass through when all the photoemitters are activated. However, a low voltage condition in any pair causes the associated photoemitter to darken, opening the photo-detector, and interrupting the flow of current. The absence of current flow is detected and provides warning of potential voltage reversal conditions in the stack. There are certain disadvantages with using optoisolators however. For instance, optoisolators are yes-no devices and do not provide an indication of the severity of the problem. Further, the response of an optoisolator may be fast enough that noise spikes might affect output, thereby necessitating signal conditioning. Most importantly, optoisolators have a specific "on" voltage (about 1.2 V) which can limit their effectiveness in this application. For instance, in a stack where the normal operating cell voltage was always over 0.6 V, a pair of "normal" cells would reliably activate the optoisolator. However, if the normal operating cell voltage could be about 0.6 V or less, then a pair of "normal" cells would not reliably activate the optoisolator. In addition, monitoring a three cell group could not be an acceptable option in some circumstances because a three cell group consisting of two "normal" cells operating at 0.8 V and one cell undergoing voltage reversal could still activate the optoisolator.

Other approaches may also be considered in order to detect voltage reversal conditions. For instance, a specially constructed sensor cell may be employed that is more sensitive than other fuel cells in the stack to certain conditions leading to voltage reversal (for example, fuel starvation of the stack). Thus, instead of monitoring many cells in a stack, only the sensor cell need be monitored and used to prevent widespread cell voltage reversal under such conditions. However, other conditions leading to voltage reversal may exist that a sensor cell cannot detect (for example, a defective individual cell in the stack). As another example, an exhaust gas monitor may be employed that detects voltage reversal by detecting the presence of or abnormal amounts of species in an exhaust gas of a fuel cell stack that originate from reactions that occur during reversal. While exhaust gas monitors can detect a reversal condition occurring within any cell in a stack and they may suggest the cause of reversal, such monitors do not generally provide any warning of an impending voltage reversal. Thus, voltage monitors offer certain advantages over these other approaches and may therefore be desirable for voltage reversal protection.

SUMMARY OF THE INVENTION

An improved cell voltage monitor for fuel cell stacks employs voltage monitoring units for monitoring cell voltage. The voltage monitoring units comprise a heating resistor, a rectifier in series with the heating resistor, and a sensing thermistor. A thermistor is a thermally sensitive resistor whose resistance varies predictably as a function of temperature. The sensing thermistor is used to sense heat generated by the heating resistor and, for this purpose, is positioned to be in thermal communication with, but electrically isolated from, the heating resistor.

The series-connected heating resistor and rectifier in the voltage monitoring unit are electrically-connected across one or more fuel cells in the stack. The polarity of the rectifier is arranged such that current is prevented from flowing through the series-connected resistor and rectifier when the voltage across the fuel cell or cells changes polarity during voltage reversal. During normal operation of the fuel cell stack however, the heating resistor is resistively heated by the fuel cell. The amount of heat generated and communicated to the sensing thermistor is a function of the voltage across the heating resistor. Thus, the temperature and hence the resistance of the sensing thermistor are indicative of fuel cell voltage.

To detect a low voltage condition, a determination is made as to whether the sensing thermistor resistance is in a range associated with low cell voltage. In this regard, a signal indicative of the sensing thermistor resistance can be obtained using a reference thermistor. For instance, the reference thermistor may be connected in series with the sensing thermistor but is thermally isolated therefrom. A reference voltage may then be applied across the series-connected sensing and reference thermistors and the voltage across the sensing thermistor measured. The resistance of the sensing thermistor may then be determined by comparing the voltage across the sensing thermistor to the reference voltage. An advantage of this approach is that the comparison can provide information about the extent of a low voltage condition along with the mere indication of the problem.

A preferred embodiment employs reference and sensing thermistors having the same resistance versus temperature characteristics (for example, same type). A diode may also be employed to prevent other signals (for example, signals from other voltage monitoring units) from affecting the sensing thermistor voltage. One end of the diode may be electrically-connected between the series-connected sensing and reference thermistors.

Resistance changes in the sensing thermistor are more readily detected if the resistance changes substantially with an increase in temperature above ambient. A resettable thermal switch, such as a polymeric positive temperature coefficient (PTC) fuse, may undergo a marked increase in resistance with temperature and is suitable for use as a sensing thermistor. In such an embodiment, the PTC fuse might be heated sufficiently during normal operation to be "open", but insufficiently heated during a low voltage condition and be "closed". A low voltage condition might thus simply be indicated by determining if the PTC fuse was open or closed. However, this approach does not provide quantitative information about the extent of a low voltage condition.

Preferably, the heating resistor in the voltage monitoring unit is also a positive temperature coefficient thermistor (that is, a heating thermistor) to reduce power consumption over the higher end of the normal operating voltage range of the fuel cells in the stack.

A cell voltage monitor for a fuel cell stack may comprise a plurality of the preceding voltage monitoring units. The series-connected heating resistors and rectifiers in each of the plurality of voltage monitoring units may themselves be connected in series. The plurality of voltage monitoring units may conveniently be mounted on a flexible printed circuit board. The heating resistor, the rectifier, and the sensing thermistor in a given voltage monitoring unit may be mounted closely together and coated with a suitable thermally conductive material, such as a thermosetting polymer. Other components may be mounted at a distance for purposes of thermal isolation.

In an embodiment employing reference thermistors and diodes (such as that described above), the series-connected reference thermistors and sensing thermistors in each of the plurality of voltage monitoring units are conveniently connected in parallel across the reference power supply. The other ends of the diodes may be connected to a common signal line and the polarity of the diodes may be set such that current is prevented from flowing from an unheated sensing thermistor to any heated thermistor. In this way, when the sensing circuit is arranged such that an unheated sensing thermistor generates a greater signal than the heated ones, the diodes stop the greater signal from sinking through the heated thermistor circuits. The presence of the greater signal on the signal line is indicative of a low voltage cell.

In an embodiment employing resettable thermal fuses (such as that described above), the resettable thermal switches in each of the plurality of voltage monitoring units may be connected in parallel. An "open" circuit condition might then exist in this parallel circuit of switches when all the cells are operating in a normal voltage range. However, a single low voltage cell would result in a "closed" circuit condition in one of the fuses and hence in the parallel circuit.

A voltage monitoring unit may be used to monitor the voltage of one or more fuel cells (for example, a pair of cells) in a fuel cell stack by electrically-connecting the series-connected heating resistor and rectifier in the unit across the cell or cells. In order to monitor the voltages of all the series-connected fuel cells in a fuel cell stack, generally a cell voltage monitor would be employed which comprises a plurality of voltage monitoring units. It is desirable to thermally isolate the sensing thermistors in the voltage monitoring units from the fuel cell stack itself in order to prevent heat generated by the stack from interfering with the function of the voltage monitoring units.

The aforementioned voltage monitoring units and cell voltage monitor are useful for monitoring for voltage reversal in fuel cell stacks, especially solid polymer electrolyte fuel cell stacks. Desirably, a low voltage in any fuel cell in the stack may be detected and an appropriate action may then be initiated to prevent damage to the cells.

BRIEF DESCRIPTION OF THE DRAWINGS

FIG. 3 is a schematic diagram of a solid polymer fuel cell stack in which each cell is equipped with a thermistor based voltage monitoring unit comprising a PTC fuse.

DETAILED DESCRIPTION OF PREFERRED EMBODIMENTS

Figure 1:
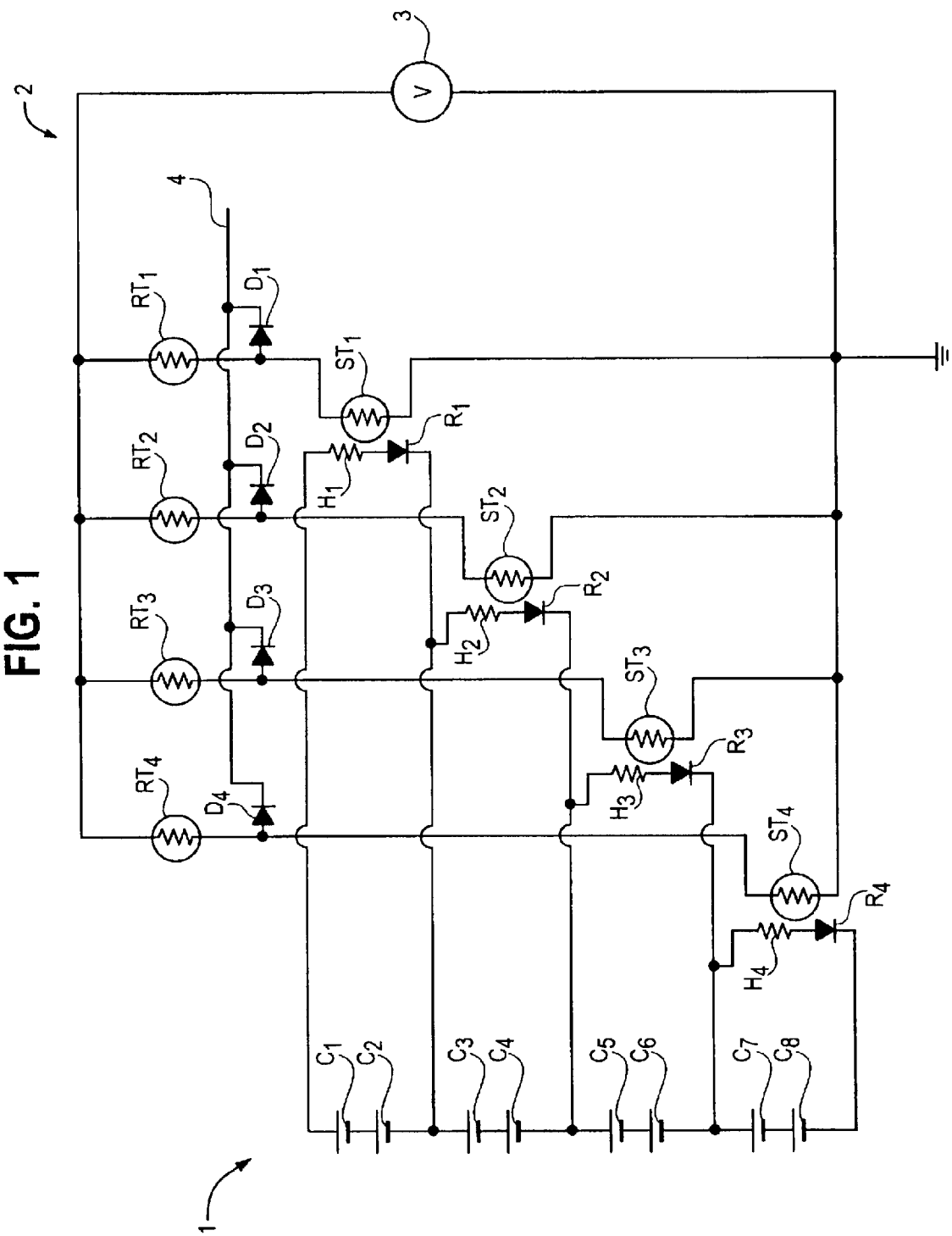
FIG. 1 is a schematic diagram of a solid polymer fuel cell stack in which each pair of cells is equipped with a thermistor-based voltage monitoring unit comprising a reference thermistor.

A solid polymer fuel cell stack equipped with a cell voltage monitor for protecting against voltage reversal is shown in the schematic diagram of FIG. 1. Fuel cell stack 1 comprises a stack of eight solid polymer electrolyte fuel cells in series $C_1$, $C_2$, . . . , $C_8$. Cell voltage monitor 2 employs four voltage monitoring units (not referenced in FIG. 1), with one unit used for each pair of cells in stack 1. Each voltage monitoring unit comprises a heating resistor $H_i$, a rectifier $R_i$, a sensing thermistor $ST_i$, a reference thermistor $RT_i$, and a diode $D_i$ where i represents a voltage monitoring unit number from 1 to 4.

As shown in FIG. 1, the voltage of each pair of fuel cells in stack 1 is monitored by a corresponding voltage monitoring unit. Current flows through series-connected heating resistor $H_i$, and rectifier $R_i$ in accordance with the voltage across the corresponding pair of fuel cells $C_{2i-1}$, $C_{2i}$ and heat is dissipated in heating resistor $H_i$. Rectifier $R_i$ is arranged such that no current flows when the voltage of the pair of fuel cells is negative (implying at least one cell is in voltage reversal) and, in this case, no heat is dissipated in heating resistor $H_i$.

Each sensing thermistor $ST_i$ is physically located near corresponding heating resistor $H_i$ and is thermal communication therewith but electrically isolated therefrom. Additionally, each sensing thermistor $ST_i$ is located to avoid contacting other significant sources of heat (for example, stack 1 and/or other heating resistors). In FIG. 1, sensing thermistors $ST_i$ Are connected in series with corresponding reference thermistors $RT_i$. Reference thermistors $RT_i$ are physically located to be at ambient temperature and are not heated significantly by heating resistors $H_i$. The series-connected sensing thermistors $ST_i$ and reference thermistors $RT_i$ are connected in parallel to reference voltage supply 3. Diodes $D_i$ are connected between common signal line 4 and each series-connected sensing thermistor $ST_i$ and reference thermistor $RT_i$. During operation of stack 1, the voltage at signal line 4 is monitored using a suitable voltage measuring apparatus.

In the embodiment of FIG. 1, sensing and reference thermistors $ST_i$, $RT_i$ are preferably of the same type and have negative temperature coefficients. Thus, when heated, the voltage across a sensing thermistor $ST_i$ will be less than that across corresponding reference thermistor $RT_i$. When not heated, the voltage across a sensing thermistor $ST_i$ will be the same as that across corresponding reference thermistor $RT_i$ (that is, half the voltage provided by reference voltage supply 3). Diodes $D_i$ prevent current from a sensing thermistor at a higher voltage from flowing through other sensing thermistors at lower voltages. Thus, common signal line 4 will indicate the highest voltage of any of the sensing thermistors in voltage monitor 2. The presence of a higher than normal voltage observed at signal line 4 thus warns of at least one low voltage pair of cells and appropriate corrective action can be taken to prevent any damage from occurring due to voltage reversal in stack 1.

An advantage of this arrangement is that the signal line can provide quantitative information about a cell pair voltage during a low voltage condition. That is, signal line voltages above normal but less than half that provided by reference voltage supply 3 are representative of a cell pair voltage below normal but above zero.

Another advantage of this arrangement is that voltage detection may be largely independent of the ambient temperature around the fuel cell stack. As long as the temperature of each set of sensing and reference thermistors $ST_i$, $RT_i$ would be similar absent the effect of heating resistors $H_i$, the ambient temperature around the fuel cell stack can vary without affecting operation of the cell voltage monitor in FIG. 1.

In selecting appropriate combinations of components for use in a voltage monitoring unit, the power drained by each heating resistor during normal stack operation should be sufficient for heating its associated sensing thermistor without involving a significant parasitic power drain on the associated fuel cell. It may therefore be preferable to use positive temperature coefficient thermistors as the heating resistors $H_i$. By so doing, the heating thermistors can generate sufficient heat to activate the sensing thermistors at the lower end of the normal operating voltage range of the cell without generating excessive heat (and hence without draining excessive power) at the higher end of the normal operating voltage range. Further, an appropriate combination of components provides for voltage detection values and response times that allow for normal stack operation without falsely alarming of voltage reversal yet while still providing adequate warning of voltage reversal in abnormal operation situations.

As an example, a solid polymer electrolyte fuel cell stack might comprise a series stack of cells normally delivering about 50 amps at about 0.6 V (maximum load) and operating at about 1 V at low load. The operating temperature of the stack might typically be in a range from about 60 to 100° C. A thermistor-based cell voltage monitor as described above may be suitable for voltage reversal protection of such a stack. For instance, 9 ohm resistors (0805 package) and I R 10MQ040 type diodes may be used as the heating resistors $H_i$ and rectifiers $R_i$ respectively. The sensing thermistors $ST_i$ and reference thermistors $RT_i$ may be Fenwal 173-103LAF-301 negative temperature coefficient devices. The diodes $D_i$ may be small signal diodes and a 12 volt supply may be used as the reference voltage supply 3.

In this example, the power dissipated through the heating resistors would be approximately 160 to 440 mW, an acceptable parasitic load. The sensing and reference thermistors are nominally about 10 kΩ but the sensing thermistors will quickly (about 10 seconds) drop and equilibrate to about 5 kΩ or lower when resistively heated at levels more than about 150 mW. Thus, the voltage across the sensing thermistors could be about one third or less that of the reference voltage (that is, less that or equal to about 4 volts) when all the cells are operating normally. When a cell pair voltage drops to zero or goes negative, the voltage across the associated sensing thermistor and hence also on signal line 4 would be 6 volts. These voltage differences are large enough to discriminate normal from abnormal voltage conditions. Timeframes of order of 10 seconds represent a reasonable response time for monitoring for voltage reversal in the fuel cell stack, yet brief spikes in the stack output would not affect the signal line value.

Figure 2:
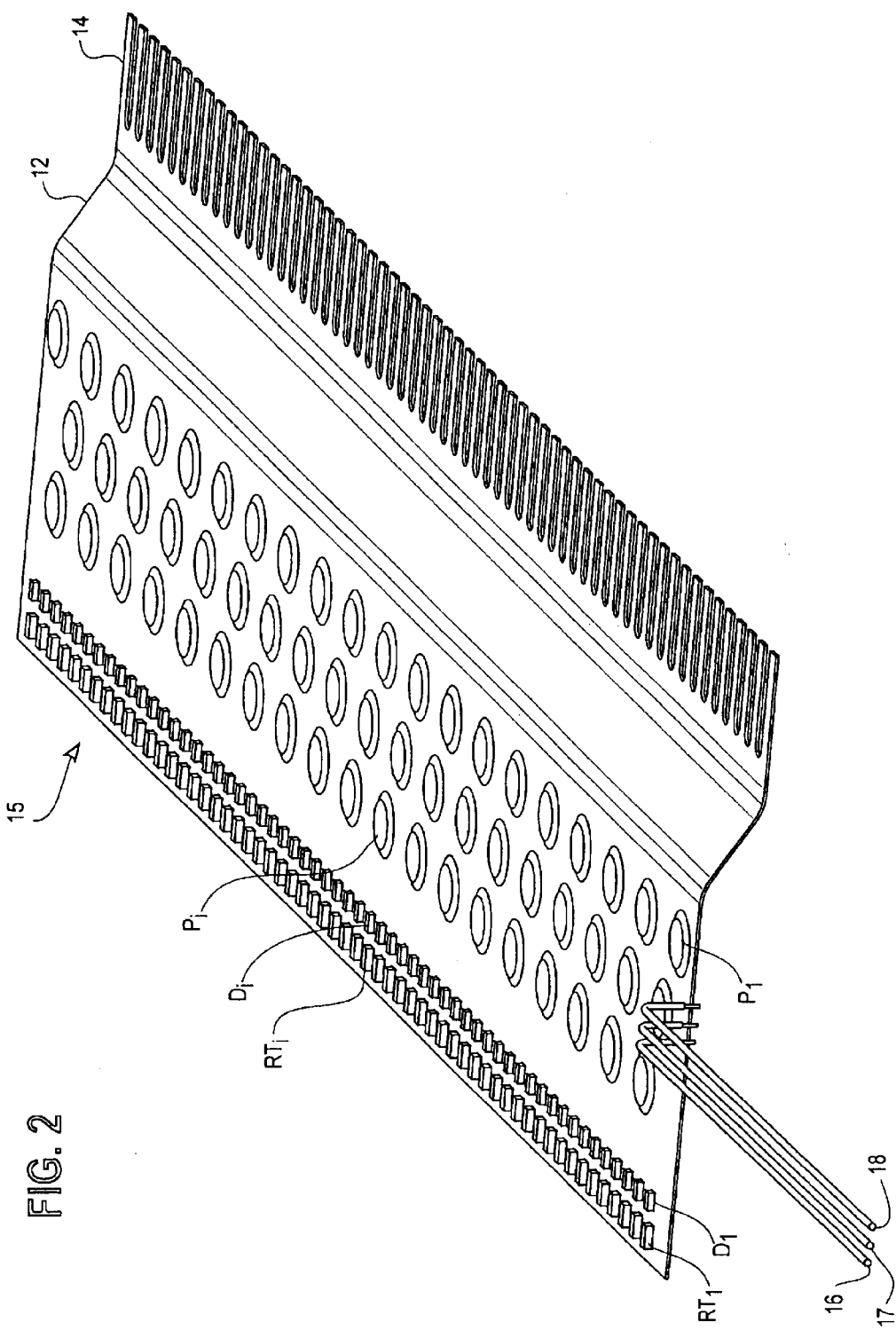
FIG. 2 shows a cell voltage monitor comprising a plurality of voltage monitoring units mounted on a flexible printed circuit board that is suitable for use with a solid polymer fuel cell stack.

A cell voltage monitor 15 suitable for use in such a solid polymer electrolyte fuel cell stack is shown in FIG. 2. A plurality of voltage monitoring units (not referenced in FIG. 2) may be surface mounted on flexible printed circuit board 12. Each unit comprises an isothermal package $P_i$, reference thermistor $RT_i$, and diode $D_i$. (FIG. 2 shows components for the first voltage monitoring unit i=1 and for an arbitrary unit i.) Isothermal package $P_i$ contains heating resistor $H_i$, rectifier $R_i$, and sensing thermistor $ST_i$ which are coated with a thermosetting polymer (such as Glob-top thermoset ME-410). Conductive traces electrically connect components in the voltage monitoring units to fuel cell contacts 14. Cell voltage monitor 15 is mounted to the edge of the fuel cell stack (not shown) by clamping or using a conductive glue such that fuel cell contacts 14 are electrically-connected appropriately to the fuel cells in the stack. The portions of printed circuit board 12 comprising packages $P_i$, reference thermistors $RT_i$, and diodes $D_i$ would not contact the fuel cell stack in order to thermally isolate them from heat generated by the stack itself. FIG. 2 also shows wire connections to the printed circuit board 12 for signal line 16 and reference voltage supply leads 17, 18.

The preceding example describes a possible combination of components and packaging suitable for monitoring pairs of cells to prevent voltage reversals in a certain type and size of fuel cell stack. However, such cell voltage monitors and/or voltage monitoring units may be useful for other purposes in solid polymer electrolyte or other types of fuel cells. It may be desirable to adapt the voltage monitoring units for purposes of monitoring individual cells. Further, alternative detection circuits may be considered that do not require reference thermistors or negative coefficient sensing thermistors. For instance, another possible embodiment is shown in FIG. 3, which employs PTC fuses as the sensing thermistors.

FIG. 3 is a schematic diagram of a solid polymer fuel cell stack in which each cell is equipped with a thermistor-based voltage monitoring unit comprising a PTC fuse. Fuel cell stack 21 comprises a stack of n solid polymer electrolyte fuel cells in series $C_1, C_2, \ldots, C_n$. Cell voltage monitor 22 comprises n corresponding voltage monitoring units $U_1, U_2, \ldots, U_n$. Each voltage monitoring unit $U_j$ (where j is a number from 1 to n) comprises a heating resistor $H_j$, a rectifier $R_j$, and a PTC sensing thermistor $S_j$. PTC sensing thermistors $S_j$ are connected in parallel to leads 23, 24. When the voltage of each fuel cell $C_j$ is in a normal operating range, thermistors $S_j$ are heated by heating resistors $H_j$ such that they exhibit high resistance (that is, open). However, when a fuel cell drops to too low a voltage, the associated PTC sensing thermistor cools and drops markedly in resistance (that is, closed). Thus, a simple continuity check at leads 23, 24 provides an indication of a low voltage cell.

While particular elements, embodiments and applications of the present invention have been shown and described, it will be understood, of course, that the invention is not limited thereto since modifications may be made by those skilled in the art without departing from the scope of the present disclosure, particularly in light of the foregoing teachings.

What is claimed is:

1. A voltage monitoring unit comprising:
   at least one cell in a fuel cell stack;
   a heating resistor;
   a rectifier in series with said heating resistor;
   said heating resistor and rectifier in series being connectable across said fuel cell, wherein the polarity of said rectifier is such that current is prevented from flowing through said rectifier when said fuel cell is in voltage reversal; and
   a sensing thermistor, said sensing thermistor being electrically isolated from and in thermal communication with said heating resistor, wherein the resistance of the sensing thermistor is indicative of the voltage of at least one fuel cell.

2. The voltage monitoring unit of claim 1 additionally comprising a reference thermistor in series with said sensing thermistor and thermally isolated from said heating resistor.

3. The voltage monitoring unit of claim 2 wherein said reference thermistor and said sensing thermistor have the same resistance as a function of temperature characteristics.

4. The voltage monitoring unit of claim 2 additionally comprising a diode electrically-connected at one end between said series-connected sensing and reference thermistors.

5. The voltage monitoring unit of claim 1 wherein the resistance of said sensing thermistor changes substantially with an increase in temperature above ambient.

6. The voltage monitoring unit of claim 5 wherein said sensing thermistor is a resettable thermal switch.

7. The voltage monitoring unit of claim 6 wherein said sensing thermistor is a polymeric positive temperature coefficient fuse.

8. The voltage monitoring unit of claim 1 wherein said heating resistor is a positive temperature coefficient thermistor.

9. The voltage monitoring unit of claim 1 wherein said heating resistor, said rectifier and said sensing thermistor are each coated with a thermosetting polymer.

10. A cell voltage monitor for a fuel cell stack comprising a plurality of the voltage monitoring units of claim 1.

11. The cell voltage monitor of claim 10 wherein the series-connected heating resistors and rectifiers in each of said plurality of voltage monitoring units are connected in series.

12. A cell voltage monitor for a fuel cell stack comprising a plurality of the voltage monitoring units of claim 2.

13. The cell voltage monitor of claim 12 wherein the series-connected reference thermistors and sensing thermistors in each of said plurality of voltage monitoring units are connected in parallel across a reference voltage supply.

14. A cell voltage monitor for a fuel cell stack comprising a plurality of the voltage monitoring units of claim 4.

15. The cell voltage monitor of claim 14 wherein the series-connected reference thermistors and sensing thermistors in each of said plurality of voltage monitoring units are connected in parallel across a reference voltage supply, and the other ends of the diodes in each of said plurality of voltage monitoring units are connected to a common signal line.

16. The cell voltage monitor of claim 15 wherein the polarity of said diodes is such that current is prevented from flowing from an unheated one of said sensing thermistors to a heated one of said sensing thermistors via said common signal line.

17. A cell voltage monitor for a fuel cell stack comprising a plurality of the voltage monitoring units of claim 6.

18. The cell voltage monitor of claim 17 wherein the resettable thermal switches in each of said plurality of voltage monitoring units are connected in parallel.

19. The cell voltage monitor of claim 10 wherein said plurality of voltage monitoring units are mounted on a flexible printed circuit board.

20. A fuel cell stack comprising the voltage monitoring unit of claim 1 wherein the series-connected heating resistor and rectifier in said voltage monitoring unit are electrically-connected across at least one fuel cell in said fuel cell stack.

21. The fuel cell stack of claim 20 wherein the polarity of said rectifier is such that current is prevented from flowing through said series-connected resistor and rectifier when said fuel cell is in voltage reversal.

22. The fuel cell stack of claim 20 wherein said stack comprises a plurality of series-connected fuel cells and a cell voltage monitor comprising a plurality of voltage monitoring units.

23. The fuel cell stack of claim 22 wherein each of said voltage monitoring units is connected across a pair of said fuel cells in said stack.

24. The fuel cell stack of claim 20 wherein the fuel cells in said stack are solid polymer electrolyte fuel cells.

25. A method for detecting a low voltage in a fuel cell in a fuel cell stack comprising:

connecting a heating resistor and a rectifier in series across said fuel cell wherein the polarity of said rectifier is such that current is prevented from flowing through said rectifier when said fuel cell is in voltage reversal;

positioning a sensing thermistor in thermal communication with and electrically isolated from said heating resistor such that said sensing thermistor is heated when current flows through said heating resistor; and obtaining a signal indicative of the resistance of said sensing thermistor, said signal detecting a low voltage in at least one fuel cell.

26. The method of claim 25 wherein said signal is obtained by:

connecting a reference thermistor in series with and thermally isolated from said sensing thermistor;

applying a reference voltage across the series-connected sensing and reference thermistors; and measuring the voltage across said sensing thermistor.

27. The method of claim 25 wherein said sensing thermistor is a resettable thermal switch and said signal indicates whether said resettable thermal switch is open or closed.

28. The method of claim 25 comprising thermally isolating said sensing thermistor from said fuel cell stack.

29. A method of monitoring for voltage reversal in a fuel cell stack comprising using the method of claim 25 to detect for any low voltage fuel cell in said fuel cell stack.

* * * * *